(12) United States Patent
Chen (10) Patent No.: US 10,866,675 B2
(45) Date of Patent: Dec. 15, 2020

(54) FORCE TOUCH DISPLAY DEVICE AND FORCE TOUCH CONTROL METHOD

(71) Applicant: WUHAN CHINA STAR OPTOELECTRONICS SEMICONDUCTOR DISPLAY TECHNOLOGY CO., LTD., Hubei (CN)

(72) Inventor: Bi Chen, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/476,083

(22) PCT Filed: Apr. 17, 2019

(86) PCT No.: PCT/CN2019/083119
§ 371 (c)(1),
(2) Date: Jul. 4, 2019

(87) PCT Pub. No.: WO2020/155410
PCT Pub. Date: Aug. 6, 2020

(65) Prior Publication Data
US 2020/0241681 A1 Jul. 30, 2020

(51) Int. Cl.
G06F 3/041 (2006.01)
G06F 3/044 (2006.01)
H01L 27/32 (2006.01)
H01L 51/52 (2006.01)

(52) U.S. Cl.
CPC ............ *G06F 3/0414* (2013.01); *G06F 3/041* (2013.01); *G06F 3/044* (2013.01); *G06F 3/0412* (2013.01);
(Continued)

(58) Field of Classification Search
CPC ........ G06F 3/0416; G06F 3/44; G06F 3/0412; G06F 3/03547; G06F 3/0445;
(Continued)

(56) References Cited

U.S. PATENT DOCUMENTS

9,542,031 B2* 1/2017 Shibata ................. G06F 3/0414
9,710,114 B2* 7/2017 Lee .......................... G06F 3/044
(Continued)

*Primary Examiner* — Dismery Mercedes
(74) *Attorney, Agent, or Firm* — Mark M. Friedman (57) ABSTRACT

The present invention provides a force touch display device and a force touch control method. The force touch display device includes a substrate, an organic light emitting diode (OLED) layer disposed on the substrate, a strain layer disposed on the OLED layer, and a touch function layer disposed on the strain layer; wherein the OLED layer comprises an anode disposed on the substrate, a light emission layer disposed on the anode, and a cathode disposed on the light emission layer and comprising a pressure detecting pattern; wherein when force touch is performed, touch detection is performed by the touch function layer, and pressure detection is performed by cooperation of the cathode and the touch function layer. By multiplexing the cathode of the OLED as a pressure induction electrodes, the force touch can be achieved without increase of a thickness of a product to improve competitivity.

5 Claims, 7 Drawing Sheets

(52) U.S. Cl.
CPC .......... *G06F 3/0416* (2013.01); *G06F 3/0445* (2019.05); *H01L 27/323* (2013.01); *H01L 51/5225* (2013.01); *G06F 2203/04104* (2013.01); *G06F 2203/04105* (2013.01)

(58) Field of Classification Search
CPC ...... G06F 3/0447; G06F 3/041; G06F 3/0414; G06F 3/0446; G06F 2203/04105; G06F 2203/04104; G02F 1/13338; H01L 27/323; H01L 2251/5338
See application file for complete search history.

(56) References Cited

U.S. PATENT DOCUMENTS

| | | | | |
|---|---|---|---|---|
| 9,981,735 | B2* | 5/2018 | Reusch | B64C 9/00 |
| 10,139,977 | B2* | 11/2018 | Wang | G06F 3/0416 |
| 10,248,243 | B2* | 4/2019 | Kim | G06F 3/0414 |
| 10,304,910 | B2* | 5/2019 | Lee | G06F 3/0443 |
| 10,496,218 | B2* | 12/2019 | Rad | G06F 3/041 |
| 10,528,168 | B2* | 1/2020 | Ye | G06F 3/0412 |
| 10,564,742 | B2* | 2/2020 | Hwang | G06F 3/04164 |
| 10,564,757 | B2* | 2/2020 | Guo | G06F 3/0414 |
| 10,579,193 | B2* | 3/2020 | Frame | G06F 3/044 |
| 10,725,593 | B2* | 7/2020 | Hirabayashi | H01L 51/5253 |
| 2017/0060340 | A1* | 3/2017 | Chen | G06F 3/044 |
| 2017/0075493 | A1* | 3/2017 | Lee | G06F 3/0414 |
| 2017/0278900 | A1* | 9/2017 | Yang | H01L 51/0097 |
| 2018/0018052 | A1* | 1/2018 | Yang | G06F 3/0443 |
| 2018/0039367 | A1* | 2/2018 | Suzuki | G02F 1/1343 |
| 2018/0095582 | A1* | 4/2018 | Hwang | H01L 27/3276 |
| 2018/0329561 | A1* | 11/2018 | Kim | G06F 3/044 |
| 2019/0243493 | A1* | 8/2019 | Ding | G06F 3/0412 |

* cited by examiner

FIG. 1

PRIOR ART

FORCE TOUCH DISPLAY DEVICE AND FORCE TOUCH CONTROL METHOD

FIELD OF INVENTION

The present invention relates to a field of display technologies, especially to force touch display device and a force touch control method.

BACKGROUND OF INVENTION

Flat display devices have advantages such as thin bodies, power saving, radiation free, and are used extensively. A conventional flat display device primarily includes liquid crystal display (LCDs) devices and organic light emitting diode display (OLED) devices.

Because the organic light emitting diode display device has advantages of self-luminescence, backlight-free characteristics, high contrast, thinness, wide view angle, and fast response times, it can be applied to flexible display panel, wide ranges of workable temperature, simple structures and manufacturing processes, it is considered to be a next generation of emerging application technology of flat displays.

The OLED display device generally includes: a substrate, an anode disposed on the substrate, an organic light emitting layer disposed on the anode, an electron transport layer disposed on the organic light emitting layer, and a cathode disposed on the electron transport layer. When it operates, holes from the anode and electrons from the cathode are emitted to the organic light emitting layer, a combination of these electrons and holes generates pairs of excitatory electron-holes, and the pairs of excitatory electron-holes are transferred from excited state to ground state to achieve light emission.

Figure 1:
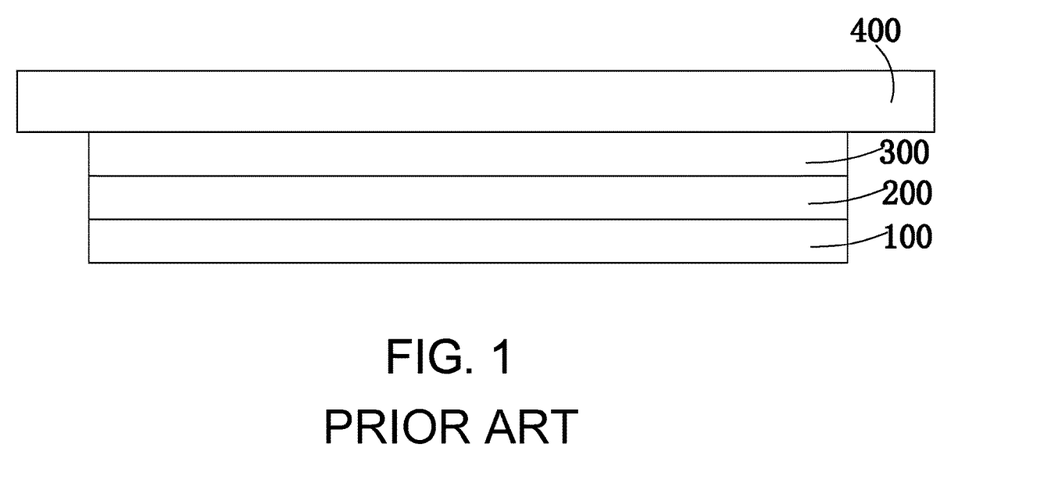
FIG. 1 is a schematic view of a structure of a conventional force touch display device.

Touch device have advantages of easy operability, intuitiveness and flexibility and have become a primary human machine interacting means of personal mobile apparatuses and integrated information terminals such as tablets, smart phones and super notebooks. Touch devices according to different principles are classified in four main types including resistive touch devices, capacitor touch devices, infrared touch devices and surface wave touch devices. A force touch technology is a new type touch technology, and it can operate according to an amount of pressure exerted to the touch device. Force touch display devices are more and more applied extensively in the field of display technologies in different industries. When a user touches and presses a force touch display device, the force touch display device can sense an amount of a force of the pressing to generate different signals such that the user can acquire different feedback messages merely by variation of force in a force touch region, which provides more various user experiences. With reference to FIG. 1, a conventional force touch display device includes a pressure sensing layer 100, a displaying layer 200, a touch layer 300, and a cover plate 400 that are sequentially stacked over one another. In the force touch display device, the touch layer 300 and the pressure sensing layer 100 are two individual film layers disposed on two sides of the displaying layer 200 respectively and increase a thickness of the device, which does not conform to the current trend of thinning.

SUMMARY OF INVENTION

An objective of the present invention is to provide a force touch display device that can achieve force touch without increase of a thickness of a product to improve competitivity.

Another objective of the present invention is also to provide a force touch control method that can achieve force touch without increase of a thickness of a product to improve competitivity.

To achieve the above objective, the present invention provides a force touch display device, including a substrate, an organic light emitting diode (OLED) layer disposed on the substrate, a strain layer disposed on the OLED layer, and a touch function layer disposed on the strain layer;

wherein the OLED layer comprises an anode disposed on the substrate, a light emission layer disposed on the anode, and a cathode disposed on the light emission layer and comprising a pressure detecting pattern;

wherein when force touch is performed, touch detection is performed by the touch function layer, and pressure detection is performed by cooperation of the cathode and the touch function layer.

The touch function layer comprises a touch substrate layer disposed on the strain layer, a plurality of induction electrode chains paralleling one another at intervals and disposed on the touch substrate layer, and a plurality of drive electrode chains paralleling one another at intervals disposed on the touch substrate layer, wherein the induction electrode chains insulatively intersect the drive electrode chains; and the cathode comprises a plurality of electrode strips paralleling one another at intervals and disposed opposite to the drive electrode chains respectively, wherein the pressure detecting pattern is formed by the electrode strips paralleling one another at intervals.

Each of the induction electrode chains comprises a plurality of induction electrodes arranged at intervals and a plurality of first connecting portions located at intersection positions between the induction electrode chains and the drive electrode chains respectively, and adjacent two of the induction electrodes are electrically connected to each other by one of the first connecting portions; and each of the drive electrode chains comprises a plurality of drive electrodes arranged at intervals and a plurality of second connecting portions located at the intersection positions between the drive electrode chains and the induction electrode chains, adjacent two of the drive electrodes are connected to each other by one of the second connecting portions, and the second connecting portions are insulated from the first connecting portions.

The strain layer comprises a deforming portion and a supporting frame surrounding the deforming portion.

Material of the deforming portion is liquid glue.

The force touch display device further comprises an optically clear adhesive disposed on the touch function layer and a protective lid disposed on the optically clear adhesive.

The present invention also provides a force touch control method, including steps as follows:

a step S1, providing a force touch display device comprising a substrate, an organic light emitting diode (OLED) layer disposed on the substrate, a strain layer disposed on the OLED layer, and a touch function layer disposed on the strain layer; the OLED layer comprises an anode disposed on the substrate, a light emission layer disposed on the anode, and a cathode disposed on the light emission layer and comprising a pressure detecting pattern;

a step S2, entering a first stage and performing touch detection by the touch function layer while the OLED layer illuminates; and a step S3, entering a second stage and performing pressure detection by cooperation of the cathode and the touch function layer while the OLED layer stops illuminating.

In the step S1, the touch function layer comprises a touch substrate layer disposed on the strain layer, a plurality of induction electrode chains, and a plurality of drive electrode chains paralleling one another at intervals and disposed on the touch substrate layer, wherein the induction electrode chains insulatively intersect the drive electrode chains; and the cathode comprises a plurality of electrode strips paralleling one another at intervals and disposed opposite to the drive electrode chains respectively, wherein the pressure detecting pattern is formed by the electrode strips paralleling one another at intervals.

A first capacitor is formed between the induction electrode chains and the drive electrode chains, and a second capacitor is formed between the drive electrode chains and electrode strips; and the step S2 performs the touch detection by detecting variation of the first capacitor, and the step S3 performs the pressure detection by detecting variation of the second capacitor.

In the step S2, a first voltage is applied to the drive electrode chains, and an OLED drive voltage is applied to the electrode strips, and the variation of first capacitor is determined by detecting time required for the induction electrode chains reaching the first voltage, to complete the touch detection; and in the step S3, a second voltage is applied to the drive electrode chains, and the OLED drive voltage is stopped from being applied to the electrode strips, and the variation of the second capacitor is determined by detecting time required for the electrode strips reaching the second voltage, to complete the pressure detection.

In the step S1, the strain layer comprises a deforming portion and a supporting frame surrounding the deforming portion.

Material of the deforming portion is liquid glue.

In the step S1, the force touch display device further comprises an optically clear adhesive disposed on the touch function layer and a protective lid disposed on the optically clear adhesive.

Each of the induction electrode chains comprises a plurality of induction electrodes arranged at intervals and a plurality of first connecting portions located at intersection positions between the induction electrode chains and the drive electrode chains respectively, and adjacent two of the induction electrodes are electrically connected to each other by one of the first connecting portions; and each of the drive electrode chains comprises a plurality of drive electrodes arranged at intervals and a plurality of second connecting portions located at the intersection positions between the drive electrode chains and the induction electrode chains, adjacent two of the drive electrodes are connected to each other by one of the second connecting portions, and the second connecting portions are insulated from the first connecting portions.

Advantages of the present invention: The present invention provides a force touch display device including a substrate, an organic light emitting diode (OLED) layer disposed on the substrate, a strain layer disposed on the OLED layer, and a touch function layer disposed on the strain layer; wherein the OLED layer comprises an anode disposed on the substrate, a light emission layer disposed on the anode, and a cathode disposed on the light emission layer and comprising a pressure detecting pattern; wherein when force touch is performed, touch detection is performed by the touch function layer, and pressure detection is performed by cooperation of the cathode and the touch function layer. By multiplexing the cathode of the OLED as a pressure induction electrodes, the force touch can be achieved without increase of a thickness of a product to improve competitivity. The present invention also provides a force touch control method that can achieve force touch without increase of a thickness of a product to improve competitivity.

DESCRIPTION OF DRAWINGS

In order to further understand the features and technical contents of the present invention, please refer to the following detailed description and drawings of the present invention. However the drawings are only provided for reference and explanation, and are not intended to limit the present invention.

In the drawing.

DETAILED DESCRIPTION OF PREFERRED EMBODIMENTS

In order to further explain the technical means and effects of the present invention, the following describes preferred embodiments of the present invention with accompanying drawings.

Figure 2:
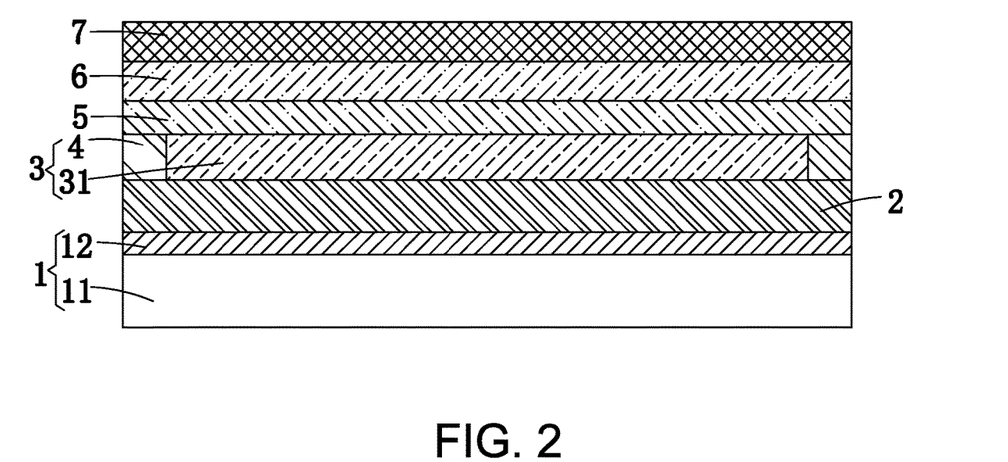
FIG. 2 is a schematic view of a structure of a force touch display device of the present invention.

With reference to FIG. 2, the present invention provides a force touch display device, including a substrate 1, an organic light emitting diode (OLED) layer 2 disposed on the substrate 1, a strain layer 3 disposed on the OLED layer 2, and a touch function layer 5 disposed on the strain layer 3. The OLED layer 2 includes an anode 21 disposed on the substrate 1, a light emission layer 22 disposed on the anode 21, and a cathode 23 disposed on the light emission layer 22 and including a pressure detecting pattern. When force touch is performed, touch detection is performed by the touch function layer 5, and pressure detection is performed by cooperation of the cathode 23 and the touch function layer 5.

Specifically, with reference to FIG. 2, the force touch display device also includes an optically clear adhesive 6 disposed on the touch layer 5 and a protective lid 7 disposed on the optically clear adhesive 6.

Furthermore, the substrate 1 includes a base substrate 11 and a thin film transistor (TFT) layer 12 located on the base substrate 11. A plurality of TFTs are formed in the TFT layer 12 and are configured to drive OLEDs to emit light. Structures and characteristics of the TFTs depend on different types of TFTs as needed. Preferably, the TFT layer 12 includes a gate electrode located on the base substrate 11, a gate insulation layer located on the gate electrode and the base substrate 11, a semiconductor layer located on the gate insulation layer, an interlayer dielectric layer located on the gate insulation layer and the semiconductor layer, a source electrode and a drain electrode located on the interlayer dielectric layer, and a passivation layer located on the source electrode, the drain electrode and the interlayer dielectric layer. The source electrode and the drain electrode contact two ends of the semiconductor layer respectively through two via holes.

Figure 3:
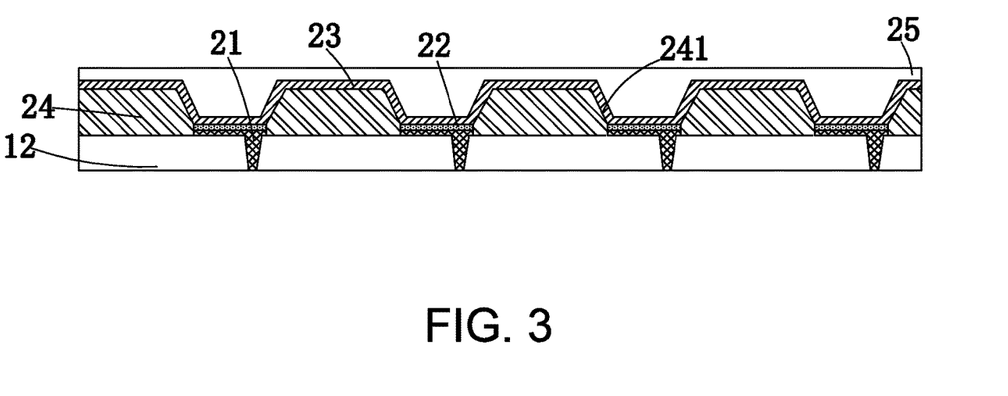
FIG. 3 is a schematic view of a detailed structure of an organic light emitting diode (OLED) layer of the force touch display device of the present invention.

Specifically, with reference to FIG. 3, the OLED layer 2 includes an anode 21 disposed on the substrate 1, a light emission layer 22 disposed on the anode 21, and a cathode 23 disposed on the light emission layer 22.

Furthermore, with reference to FIG. 3, the OLED layer 2 also includes a pixel definition layer 24 disposed on the substrate 1 and a thin film encapsulation layer 25 disposed on the cathode 23. The anode 21 is formed between the pixel definition layer 24 and the substrate 1, and the anode 21 is plural. The anodes 21 are arranged in an array. A plurality of pixel definition slots 241 are defined in the pixel definition layer 24 corresponding to the anodes 21. Each of the pixel definition slots 241 exposes one of the anodes 21. The light emission layer 22 is defined in the pixel definition slots 241. The cathode 23 is disposed on the light emission layer 22 and the pixel definition layer 24. The anodes 21 are electrically connected to the TFT layer 12.

Specifically, the strain layer 3 includes a deforming portion 31 and a supporting frame 4 surrounding the deforming portion 31. Preferably, material of the deforming portion 31 is liquid glue.

Figure 4:
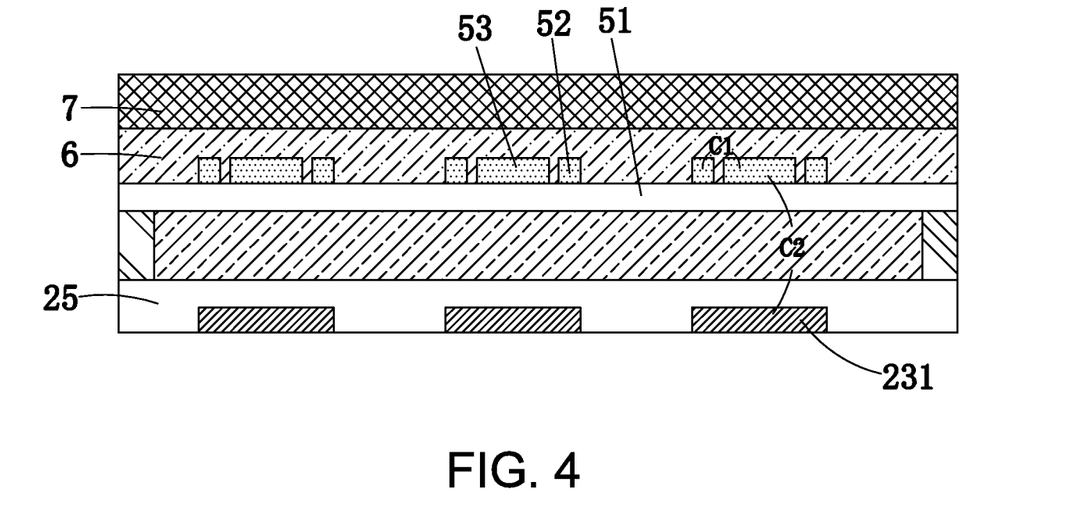
FIG. 4 is a schematic view of detailed structures of a cathode and a touch layer of a force touch display device of the present invention.

Specifically, with reference to FIG. 4, the touch function layer 5 includes a touch substrate layer 51 disposed on the strain layer 3, a plurality of induction electrode chains 52 disposed on the touch substrate layer 51 and paralleling one another at intervals, a plurality of drive electrode chains 53 and disposed on the touch substrate layer 51 and paralleling one another at intervals. The induction electrode chains 52 insulatively intersect the drive electrode chains 53. The cathode 23 includes a plurality of electrode strips 231 paralleling to another at intervals and disposed opposite to the drive electrode chains 53 respectively. A force touch pattern is formed by the electrode strips 231 that parallel one another at intervals.

Figure 5:
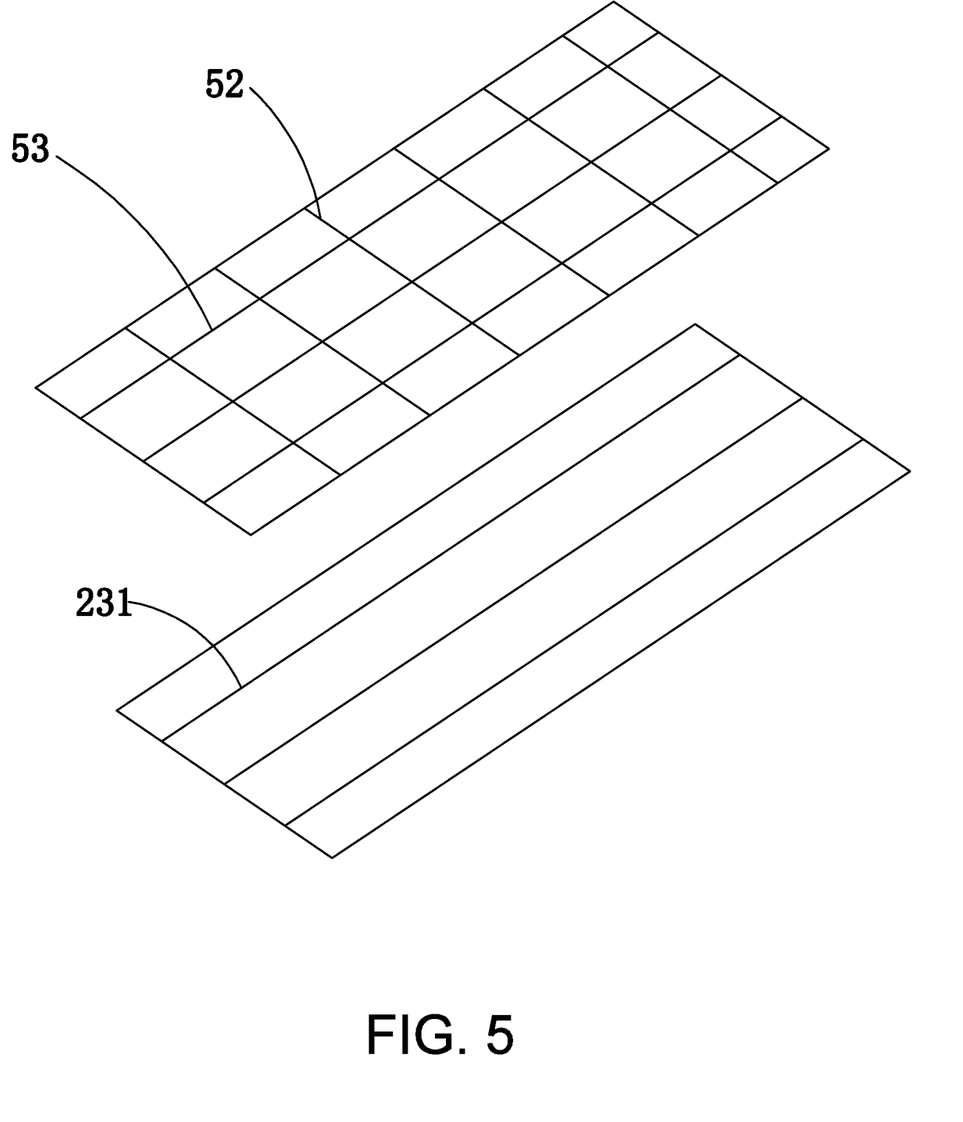
FIG. 5 is a schematic view of relationships of drive electrode chains, induction electrode chains, and the cathode of the force touch display device of the present invention.

It should be noted that, with reference to FIG. 5, the drive electrode chains 53 and the induction electrode chains 52 are integrated on the touch substrate layer 51. Preferably, the drive electrode chains 53 perpendicularly intersect the induction electrode chains 52. The drive electrode chains 53 extends longitudinally, and the induction electrode chains 52 extends transversely. The electrode strips 231 of the cathode 23 parallel the drive electrode chains 53 at intervals, are arranged along a traverse direction intervals and extend longitudinally.

Figure 6:
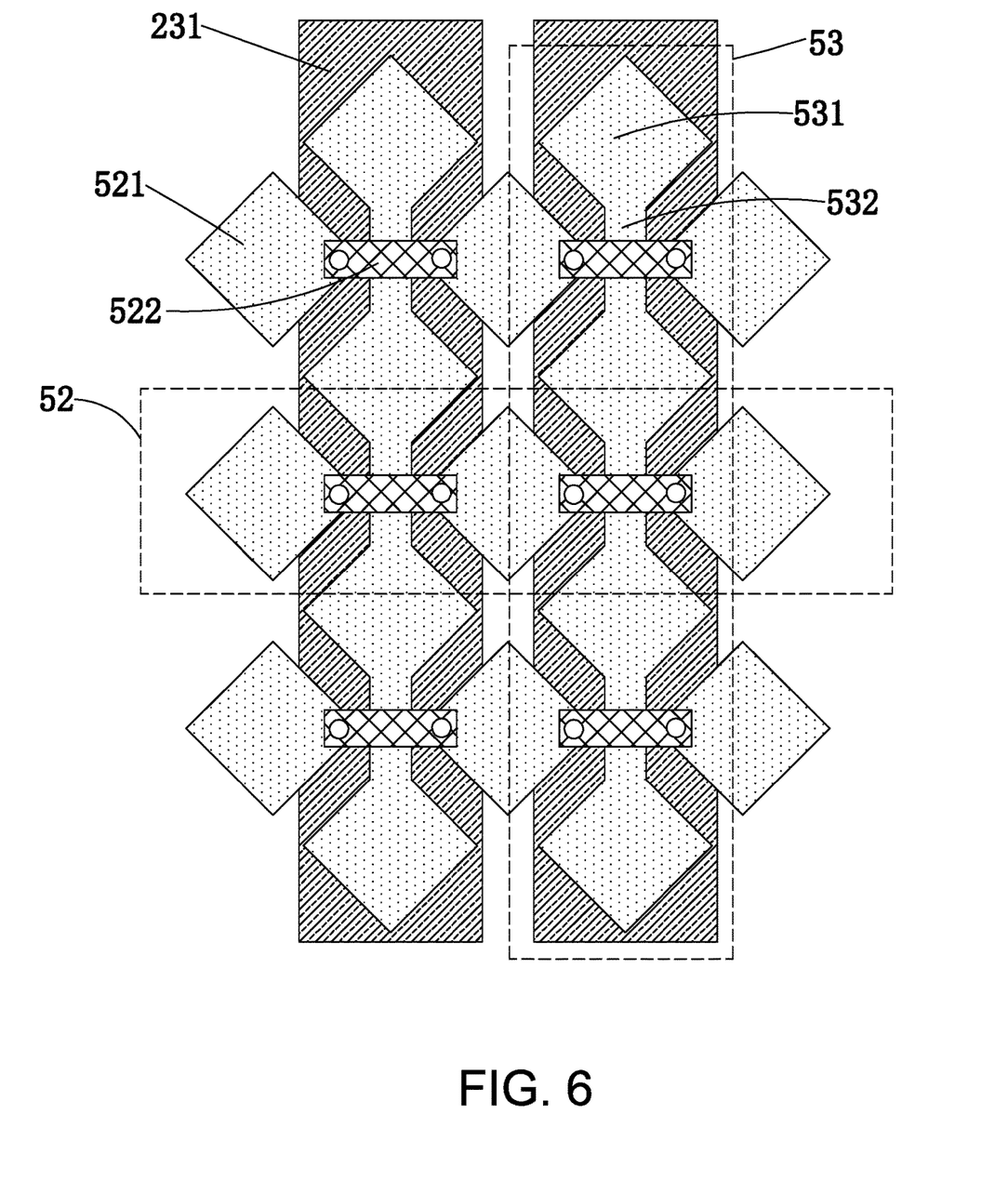
FIG. 6 is a schematic view of detailed structures of the drive electrode chains, the induction electrode chains, and the cathode of the force touch display device of the present invention.

Furthermore, with reference to FIG. 6, each of the induction electrode chains 52 includes a plurality of induction electrodes 521 paralleling one another at intervals and a plurality of first connecting portions 522 at intersection positions between the induction electrode chains 52 and the drive electrode chains 53. Adjacent two of the induction electrodes 521 are electrically connected to each other by one of the first connecting portions 522. Each of the drive electrode chains 53 includes a plurality of drive electrodes 531 paralleling one another at intervals and a plurality of second connecting portions 532 located at the intersection positions between the drive electrode chains 53 and the induction electrode chains 52. Adjacent two of the drive electrodes 531 are electrically to each other through one of the second connecting portions 532. The second connecting portions 532 are insulated from the first connecting portions 522. In an embodiment of the present invention, the first connecting portions 522 are located above the second connecting portions 523, and an insulation layer is formed between the first connecting portions 522 and the second connecting portions 523. Each of the first connecting portions 522 is connected to two of the induction electrodes 521 through via holes defined through the insulation layer.

It is worth mentioning that one of the electrode strips 231 corresponds to and is disposed right under each of the drive electrode chains 53. Material of the induction electrode chains 52, drive electrode chains 53, and cathode 23 can include gold, silver, copper, lithium, sodium, potassium, magnesium, aluminum, zinc, and a combination thereof, and alternatively can include indium tin oxide, aluminum-doped zinc oxide, antimony-doped tin oxide, and a combination thereof. Preferably, material of the induction electrode chains 52, drive electrode chains 53 and cathode 23 can both be indium tin oxide with excellent conductivity and light transmittance.

Specifically, with reference to FIG. 4, in the force touch display device of the present invention, a first capacitor C1 is formed between the induction electrode chains 52 and the drive electrode chains 53. The touch detection is performed by detecting variation of the first capacitor C1. A second capacitor C2 is formed between the drive electrode chains 53 and the electrode strips 231. The pressure detection is performed by detection variation of the second capacitor C2.

Figure 7:
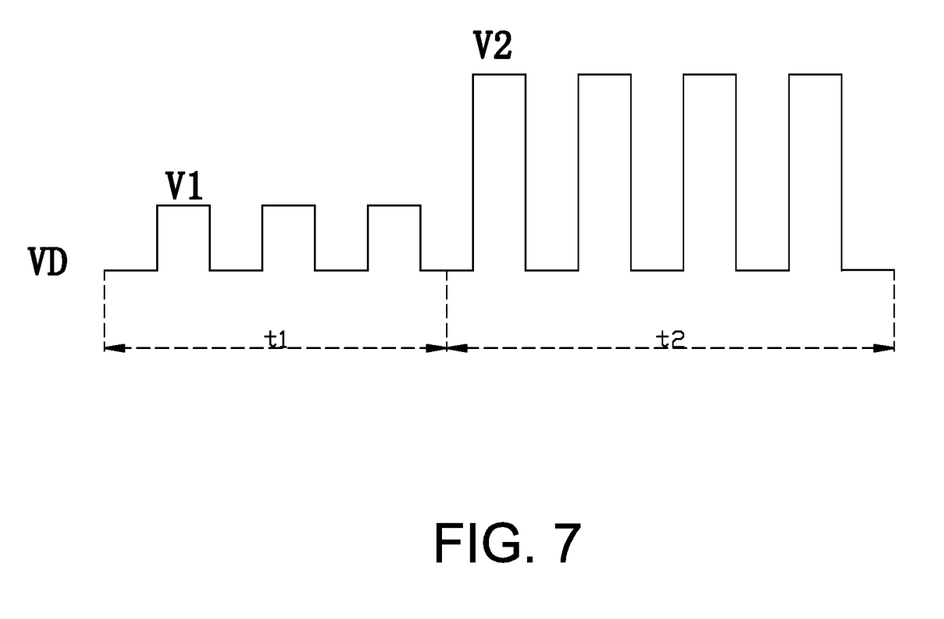
FIG. 7 is a drive waveform chart of the force touch display device of the present invention.

Specifically, with reference to FIG. 7, a manufacturing process of the force touch display device sequentially includes a first stage t1 and a second stage t2. In the first stage t1, a first voltage V1 is applied to the drive electrode chains 53, and an OLED drive voltage is applied to the electrode strips 231. In the second stage t2, a second voltage V2 is applied to the drive electrode chains 53, and the OLED drive voltage is stopped from being applied to the electrode strips 231.

Furthermore, in the first stage t1, the variation of the first capacitor C1 determined by by detecting time required for the induction electrode chains 52 reaching the first voltage V1, to complete the touch detection. In the second stage t2, the variation of the second capacitor C2 is determined by detecting time required for the electrode strips 231 reaching the second voltage V2, to complete the pressure detection.

It should be noted that when pressure is applied to the force touch display device, a deformation layer 31 is squeezed such that a distance between two electrode plates of the second capacitor C2 is reduced to change an amount of the second capacitor C2 Therefore, the amount of the second capacitor C2 can reflect an amount of the pressure applied to the force touch display device.

With reference to FIG. 7, a detailed working process of the force touch display device of the present invention is as follows: A pulse signal VD is applied to the drive electrode chains 53, a pulse high voltage of the pulse signal in the first stage t1 is a first voltage V1, and a pulse high voltage of the pulse signal in the second stage is a second voltage V2. In the first stage t1, the first capacitor C1 is electrified through the drive electrode chains 53, and a time required for the induction electrode chains 52 reaching first voltage V1 is detected to determine whether variation of the first capacitor C1 occurs. If the time required for the induction electrode chains 52 reaching first voltage V1 is constant, it is determined that no variation of the first capacitor C1 occurs and no touch occurs. If the time required for the induction electrode chains 52 reaching the first voltage V1 varies, it is determined that variation of the first capacitor C1 occurs, touch occurs and a touch position is identified, and at the meantime, in first stage t1, an OLED drive voltage is applied to the electrode strips 231 to drive the light emission layer 22 of the OLED to radiate, and the voltage thereof is constant without being affected by the drive electrode chains 53. In the second stage t2, a OLED drive voltage on the electrode strips 231 is removed, and at the meantime, a voltage of the electrode strips 231 will be affected by the pulse signal VD of the drive electrode chains 53. At the same time, the pulse high voltage of the pulse signal VD is the second voltage V2, 通過偵測 a time required for the electrode strips 231 reaching the second voltage V2 is detected to determine whether variation of the second capacitor C2 occurs. If the time required for the electrode strips 231 reaching the second voltage V2 is constant, it is determined that no variation of the second capacitor C2 occurs and no touch occurs. If the time required for the electrode strips 231 reaching the second voltage V2 varies, it is determined that variation of the second capacitor C2 occurs, touch occurs, and an amount of pressure is determined based on an amount of the variation of the second capacitor C2. Finally, a position coordinate and a pressure amount of touch can be acquired by a touch position message fed back from the induction electrode chains 52 and a pressure amount message fed back from the electrode strips 231.

It is worth mentioning that the second voltage V2 is far greater than the first voltage V1. Because a coupling area between the drive electrode chains 53 and the electrode strips 231, the preset second voltage V2 is far greater than the first voltage V1, which can reduce a charging time. Furthermore, the greater preset second voltage V2 can exclude interference of conductive structures in the TFT layer 2 and improve sensitivity of force touch.

Figure 8:
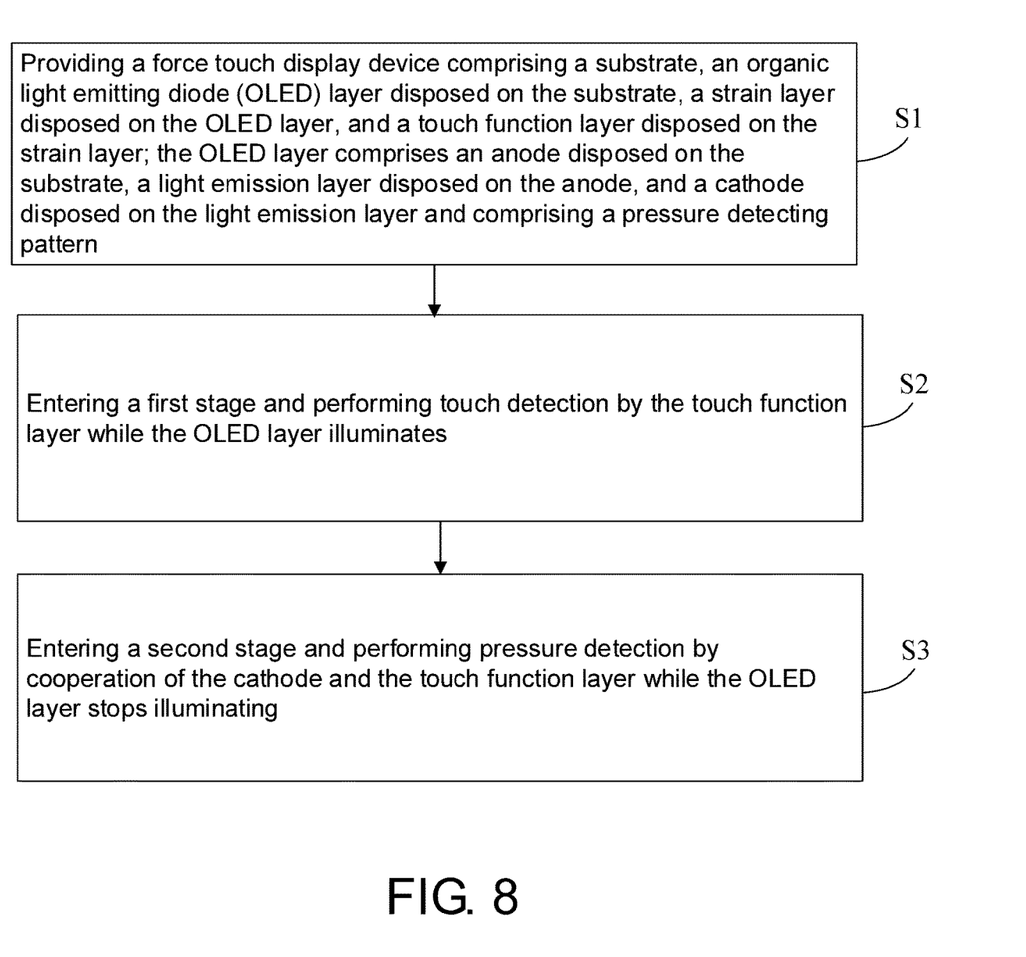
FIG. 8 is a flowchart of the force touch control method of the present invention.

With reference to FIG. 8, the present invention also provides a force touch control method, including: a step S1, a step S2, and a step S3.

The step S1 includes providing a force touch display device including a substrate 1, an OLED layer 2 disposed on the substrate 1, a strain layer 3 disposed on the OLED layer 2, and a touch function layer 5 disposed on the strain layer 3. The OLED layer 2 includes an anode 21 disposed on the substrate 1, a light emission layer 22 disposed on the anode 21, and a cathode 23 disposed on the light emission layer 22 and having a pressure detecting pattern.

Specifically, with reference to FIG. 2, the force touch display device further includes an optically clear adhesive 6 disposed on the touch layer 5, and a protective lid 7 disposed on the optically clear adhesive 6.

Furthermore, the substrate 1 includes a base substrate 11 and a thin film transistor (TFT) layer 12 located on the base substrate 11. A plurality of TFTs are formed in the TFT layer 12 and are configured to drive OLEDs to emit light. Structures and characteristics of the TFTs depend on different types of TFTs as needed. Preferably, the TFT layer 12 includes a gate electrode located on the base substrate 11, a gate insulation layer located on the gate electrode and the base substrate 11, a semiconductor layer located on the gate insulation layer, an interlayer dielectric layer located on the gate insulation layer and the semiconductor layer, a source electrode and a drain electrode located on the interlayer dielectric layer, and a passivation layer located on the source electrode, the drain electrode and the interlayer dielectric layer. The source electrode and the drain electrode contact two ends of the semiconductor layer respectively through two via holes.

Specifically, with reference to FIG. 3, the OLED layer 2 includes an anode 21 disposed on the substrate 1, a light emission layer 22 disposed on the anode 21, and a cathode 23 disposed on the light emission layer 22.

Furthermore, with reference to FIG. 3, the OLED layer 2 also includes a pixel definition layer 24 disposed on the substrate 1 and a thin film encapsulation layer 25 disposed on the cathode 23. The anode 21 is formed between the pixel definition layer 24 and the substrate 1, and the anode 21 is plural. The anodes 21 are arranged in an array. A plurality of pixel definition slots 241 are defined in the pixel definition layer 24 corresponding to the anodes 21. Each of the pixel definition slots 241 exposes one of the anodes 21. The light emission layer 22 is defined in the pixel definition slots 241. The cathode 23 is disposed on the light emission layer 22 and the pixel definition layer 24. The anodes 21 are electrically connected to the TFT layer 12.

Specifically, the strain layer 3 includes a deforming portion 31 and a supporting frame 4 surrounding the deforming portion 31. Preferably, material of the deforming portion 31 is liquid glue.

Specifically, with reference to FIG. 4, the touch function layer 5 includes a touch substrate layer 51 disposed on the strain layer 3, a plurality of induction electrode chains 52 disposed on the touch substrate layer 51 and paralleling one another at intervals, a plurality of drive electrode chains 53 and disposed on the touch substrate layer 51 and paralleling one another at intervals. The induction electrode chains 52 insulatively intersect the drive electrode chains 53. The cathode 23 includes a plurality of electrode strips 231 paralleling to another at intervals and disposed opposite to the drive electrode chains 53 respectively. A force touch pattern is formed by the electrode strips 231 that parallel one another at intervals.

It should be noted that, with reference to FIG. 5, the drive electrode chains 53 and the induction electrode chains 52 are integrated on the touch substrate layer 51. Preferably, the drive electrode chains 53 perpendicularly intersect the induction electrode chains 52. The drive electrode chains 53 extends longitudinally, and the induction electrode chains 52 extends transversely. The electrode strips 231 of the cathode 23 parallel the drive electrode chains 53 at intervals, are arranged along a traverse direction intervals and extend longitudinally.

Furthermore, with reference to FIG. 6, each of the induction electrode chains 52 includes a plurality of induction electrodes 521 paralleling one another at intervals and a plurality of first connecting portions 522 at intersection positions between the induction electrode chains 52 and the drive electrode chains 53. Adjacent two of the induction electrodes 521 are electrically connected to each other by one of to first connecting portions 522. Each of the drive electrode chains 53 includes a plurality of drive electrodes 531 paralleling one another at intervals and a plurality of second connecting portions 532 located at the intersection positions between the drive electrode chains 53 and the induction electrode chains 52. Adjacent two of the drive electrodes 531 are electrically to each other through one of the second connecting portions 532. The second connecting portions 532 are insulated from the first connecting portions 522. In an embodiment of the present invention, the first connecting portions 522 are located above the second connecting portions 523, and an insulation layer is formed between the first connecting portions 522 and the second connecting portions 523. Each of the first connecting portions 522 is connected to two of the induction electrodes 521 through via holes defined through the insulation layer.

Furthermore, one of the electrode strips 231 corresponds to and is disposed right under each of the drive electrode chains 53. Material of the induction electrode chains 52, drive electrode chains 53, and cathode 23 can include gold, silver, copper, lithium, sodium, potassium, magnesium, aluminum, zinc, and a combination thereof, and alternatively can include indium tin oxide, aluminum-doped zinc oxide, antimony-doped tin oxide, and a combination thereof. Preferably, material of the induction electrode chains 52, drive electrode chains 53 and cathode 23 can both be indium tin oxide with excellent conductivity and light transmittance.

The step S2 includes entering a first stage t1 and performing touch detection by the touch function layer 5 while the OLED layer 2 illuminates.

The step S3 includes entering a second stage t2 and performing pressure detection by cooperation of the cathode 23 and the touch function layer 5 while the OLED layer 2 stops illuminating.

Specifically, with reference to FIG. 4, a first capacitor C1 is formed between the induction electrode chains 52 and the drive electrode chains 53. A second capacitor C2 is formed between the drive electrode chains 53 and the electrode strips 231. In the step S2, the touch detection is performed by detecting variation of the first capacitor C1. In the step S3, the pressure detection is performed by detection variation of the second capacitor C2.

Specifically, with reference to FIG. 7, in the step S2, a first voltage V1 is applied to the drive electrode chains 53, and an OLED drive voltage is applied to the electrode strips 231. In the step S3, a second voltage V2 is applied to the drive electrode chains 53, and the OLED drive voltage is stopped from being applied to the electrode strips 231.

Furthermore, in the step S2, a time required for the induction electrode chains 52 reaching the first voltage V1 is detected to determine whether variation of the first capacitor C1 occurs to complete the touch detection. In the step S3, a time required for the electrode strips 231 reaching the second voltage V2 is detected to determine whether variation of second capacitor C2 occurs to complete the pressure detection.

It should be noted that when pressure is applied to the force touch display device, a deformation layer 31 is squeezed such that a distance between two electrode plates of the second capacitor C2 is reduced to change an amount of the second capacitor C2 Therefore, the amount of the second capacitor C2 can reflect an amount of the pressure applied to the force touch display device.

With reference to FIG. 7, a detailed working process of the step S2 and the step S3 of the force touch control method of the present invention is as follows: A pulse signal VD is applied to the drive electrode chains 53, a pulse high voltage of the pulse signal in the first stage t1 is a first voltage V1, and a pulse high voltage of the pulse signal in the second stage is a second voltage V2. In the first stage t1, the first capacitor C1 is electrified through the drive electrode chains 53, and a time required for the induction electrode chains 52 reaching first voltage V1 is detected to determine whether variation of the first capacitor C1 occurs. If the time required for the induction electrode chains 52 reaching first voltage V1 is constant, it is determined that no variation of the first capacitor C1 occurs and no touch occurs. If the time required for the induction electrode chains 52 reaching the first voltage V1 varies, it is determined that variation of the first capacitor C1 occurs, touch occurs and a touch position is identified, and at the meantime, in first stage t1, an OLED drive voltage is applied to the electrode strips 231 to drive the light emission layer 22 of the OLED to radiate, and the voltage thereof is constant without being affected by the drive electrode chains 53. In the second stage t2, a OLED drive voltage on the electrode strips 231 is removed, and at the meantime, a voltage of the electrode strips 231 will be affected by the pulse signal VD of the drive electrode chains 53. At the same time, the pulse high voltage of the pulse signal VD is the second voltage V2, 通過偵測 a time required for the electrode strips 231 reaching the second voltage V2 is detected to determine whether variation of the second capacitor C2 occurs. If the time required for the electrode strips 231 reaching the second voltage V2 is constant, it is determined that no variation of the second capacitor C2 occurs and no touch occurs. If the time required for the electrode strips 231 reaching the second voltage V2 varies, it is determined that variation of the second capacitor C2 occurs, touch occurs, and an amount of pressure is determined based on an amount of the variation of the second capacitor C2. Finally, a position coordinate and a pressure amount of touch can be acquired by a touch position message fed back from the induction electrode chains 52 and a pressure amount message fed back from the electrode strips 231.

It is worth mentioning that the second voltage V2 is far greater than the first voltage V1. Because a coupling area between the drive electrode chains 53 and the electrode strips 231, the preset second voltage V2 is far greater than the first voltage V1, which can reduce a charging time. Furthermore, the greater preset second voltage V2 can exclude interference of conductive structures in the TFT layer 2 and improve sensitivity of force touch.

As described above, the present invention provides a force touch display device including a substrate, an organic light emitting diode (OLED) layer disposed on the substrate, a strain layer disposed on the OLED layer, and a touch function layer disposed on the strain layer; wherein the OLED layer comprises an anode disposed on the substrate, a light emission layer disposed on the anode, and a cathode disposed on the light emission layer and comprising a pressure detecting pattern; and wherein when force touch is performed, touch detection is performed by the touch function layer, and pressure detection is performed by cooperation of the cathode and the touch function layer. By multiplexing the cathode of the OLED as a pressure induction electrodes, the force touch can be achieved without increase of a thickness of a product to improve competitivity. The present invention also provides a force touch control method that can achieve force touch without increase of a thickness of a product to improve competitivity.

As described above, for a person of ordinary skill in the art, various other changes and modifications can be made in accordance with the technical concept and technical concept of the present invention, and all such changes and modifications should fall within the scope of protection of the present invention.

What is claimed is:
1. A force touch control method, comprising:
a step S1, providing a force touch display device comprising a substrate, an organic light emitting diode (OLED) layer disposed on the substrate, a strain layer disposed on the OLED layer, and a touch function layer disposed on the strain layer; the OLED layer comprises an anode disposed on the substrate, a light emission layer disposed on the anode, and a cathode disposed on the light emission layer and comprising a pressure detecting pattern;

a step S2, entering a first stage and performing touch detection by the touch function layer while the OLED layer illuminates; and a step S3, entering a second stage and performing pressure detection by cooperation of the cathode and the touch function layer while the OLED layer stops illuminating;

wherein in the step S1, the touch function layer comprises a touch substrate layer disposed on the strain layer, a plurality of induction electrode chains, and a plurality of drive electrode chains paralleling one another at intervals and disposed on the touch substrate layer, the induction electrode chains insulatively intersect the drive electrode chains, and the cathode comprises a plurality of electrode strips paralleling one another at intervals and disposed opposite to the drive electrode chains respectively, wherein the pressure detecting pattern is formed by the electrode strips paralleling one another at intervals;

wherein a first capacitor is formed between the induction electrode chains and the drive electrode chains, and a second capacitor is formed between the drive electrode chains and electrode strips, and the step S2 performs the touch detection by detecting variation of the first capacitor, and the step S3 performs the pressure detection by detecting variation of the second capacitor;

wherein in the step S2, a first voltage is applied to the drive electrode chains, and an OLED drive voltage is applied to the electrode strips, and the variation of first capacitor is determined by detecting time required for the induction electrode chains reaching the first voltage to complete the touch detection, and in the step S3, a second voltage is applied to the drive electrode chains, the OLED drive voltage is stopped from being applied to the electrode strips, and the variation of the second capacitor is determined by detecting time required for the electrode strips reaching the second voltage, to complete the pressure detection.

2. The force touch control method as claimed in claim 1, wherein in the step S1, the strain layer comprises a deforming portion and a supporting frame surrounding the deforming portion.

3. The force touch control method as claimed in claim 2, wherein material of the deforming portion is liquid glue.

4. The force touch control method as claimed in claim 1, wherein in the step S1, the force touch display device further comprises an optically clear adhesive disposed on the touch function layer and a protective lid disposed on the optically clear adhesive.

5. The force touch control method as claimed in claim 1, wherein each of the induction electrode chains comprises a plurality of induction electrodes arranged at intervals and a plurality of first connecting portions located at intersection positions between the induction electrode chains and the drive electrode chains respectively, and adjacent two of the induction electrodes are electrically connected to each other by one of the first connecting portions; and each of the drive electrode chains comprises a plurality of drive electrodes arranged at intervals and a plurality of second connecting portions located at the intersection positions between the drive electrode chains and the induction electrode chains, adjacent two of the drive electrodes are connected to each other by one of the second connecting portions, and the second connecting portions are insulated from the first connecting portions.

\* \* \* \* \*

UNITED STATES PATENT AND TRADEMARK OFFICE
CERTIFICATE OF CORRECTION

PATENT NO. : 10,866,675 B2  
APPLICATION NO. : 16/476083  
DATED : December 15, 2020  
INVENTOR(S) : Bi Chen Page 1 of 1

It is certified that error appears in the above-identified patent and that said Letters Patent is hereby corrected as shown below:

On the Title Page (30) Foreign Application Priority Data insert:  
--January 29, 2019 (CN) 201910087765.6--

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*